(12) United States Patent
Piao et al.

(10) Patent No.: US 8,017,285 B2
(45) Date of Patent: Sep. 13, 2011

(54) MASKING PROCESS USING PHOTORESIST

(75) Inventors: Yunfeng Piao, Beijing (CN); Chunbae Park, Beijing (CN)

(73) Assignee: Beijing BOE Optoelectronics Technology Co. Ltd., Beijing (CN)

( * ) Notice: Subject to any disclaimer, the term of this patent is extended or adjusted under 35 U.S.C. 154(b) by 342 days.

(21) Appl. No.: 12/128,762

(22) Filed: May 29, 2008

(65) Prior Publication Data

US 2009/0130571 A1   May 21, 2009

(30) Foreign Application Priority Data

Nov. 15, 2007   (CN) .......................... 2007 1 0177425

(51) Int. Cl.
   *G03F 1/00*   (2006.01)
(52) U.S. Cl. .......... 430/5; 430/394; 430/311; 430/270.1
(58) Field of Classification Search .............. 430/5, 311, 430/394, 270.1, 313; 355/53; 438/106; 349/152
   See application file for complete search history.

(56) References Cited

U.S. PATENT DOCUMENTS

| | | | | |
|---|---|---|---|---|
| 6,064,466 A * | 5/2000 | Sato et al. | ........................ | 355/53 |
| 2003/0008242 A1* | 1/2003 | Schedel et al. | ................ | 430/313 |
| 2005/0078264 A1* | 4/2005 | Yoo et al. | ....................... | 349/152 |
| 2007/0224520 A1* | 9/2007 | Ogata et al. | ........................ | 430/5 |
| 2007/0243662 A1* | 10/2007 | Johnson et al. | ............... | 438/106 |
| 2007/0248911 A1* | 10/2007 | Iwasawa et al. | ............ | 430/270.1 |
| 2007/0259275 A1* | 11/2007 | Van Herpen et al. | .............. | 430/5 |

FOREIGN PATENT DOCUMENTS

| | | |
|---|---|---|
| JP | 61-292637 A | 12/1986 |
| JP | 0-235062 A | 9/1990 |
| JP | 03-057697 A | 3/1991 |
| JP | 10-200260 A | 7/1998 |
| JP | 2001-76385 A | 3/2001 |
| JP | 2003-177516 A | 6/2003 |
| JP | 2004-066658 A | 3/2004 |
| JP | 2007-42212 A | 2/2007 |
| JP | 2007-226964 A | 9/2007 |
| KR | 10-0652062 B1 | 11/2006 |

* cited by examiner

*Primary Examiner* — Mark F Huff
*Assistant Examiner* — Rashid Alam
(74) *Attorney, Agent, or Firm* — Ladas & Parry LLP

(57) ABSTRACT

The invention provides a masking process using photoresist, comprising: attaching a compress mask plate to a substrate; coating photoresist in a mask pattern of the compress mask plate; baking the photoresist from the substrate side; removing the compress mask plate from the substrate to form a desired photoresist pattern on the substrate. The inventive method simplifies the photolithography process, thereby the process time is shortened and the yield is increased.

12 Claims, 10 Drawing Sheets

MASKING PROCESS USING PHOTORESIST

BACKGROUND OF THE INVENTION

The present invention relates to a masking process.

A thin film transistor liquid crystal display (TFT LCD), which has the advantage of small volume, low power consumption, and substantial no radiation, has become a mainstream of the present flat panel displays. A TFT LCD panel is formed by assembling a color filter substrate and a TFT array substrate opposing each other with a liquid crystal layer interposed therebetween. An array substrate typically is manufactured through a commonly used five-mask (5Mask) or a four-mask (4Mask) process. In the process for manufacturing an array substrate, the steps of film depositing, photolithography processing using a mask (photo mask), and etching are performed repeatedly for several times. Taking a five-mask process as an example, there are five steps, each of which includes photolithography using one mask. The five steps include those for forming a gate electrode and a gate line, forming a gate insulating layer and amorphous silicon semiconductor layer, forming a source/drain electrode and a data line, forming a passivation protection layer, and forming a pixel electrode, on a substrate.

Currently, a conventional photolithography process includes coating a photoresist, pre-baking, exposing with a mask, developing, and post-baking, and these steps have great influence on forming of a pattern on a TFT-LCD array substrate. Coating a photoresist is to coat a photoresist on a substrate on which a film is formed by a previous process. Pre-baking is to pre-heat the photoresist and remove the water from the photoresist to increase the adhesion between the photoresist and the substrate. Exposing is to irradiate light such as UV light through a mask onto a certain portion of the photoresist. Developing is, for example, to remove the portion of the photoresist that is exposed by using a developer so as to form a required pattern. Post-baking is, for example, to cure the unexposed photoresist in the pattern and meanwhile to increase the adhesion with the substrate, so as to avoid a phenomenon of over-etching when performing etching in the subsequent process and ensure the integrity of the pattern.

A conventional mask, for example, is to form a substantial fine pattern on a substrate, so that a portion of the photoresist is exposed where UV light passes through the mask when UV light source is irradiated. Next, for example, the exposed photoresist is removed in development to form a desired pattern. The mask pattern on a mask plate includes a transparent part, a translucent part, a hole-shape structure and/or the like.

FIGS. 1a-5b are section views illustrating photolithography procedures in manufacturing of an array substrate using a conventional technology.

FIG. 1a is a section view illustrating exposure using a first mask in a conventional process. FIG. 1b is a section view after developing using the first mask in a conventional process. FIG. 2a is a section view illustrating exposure using a second mask in a conventional process. FIG. 2b is a section view after developing using the second mask in a conventional process. FIG. 3a is a section view illustrating exposure using a third mask in a conventional process. FIG. 3b is a section view after developing using the third mask in a conventional process. FIG. 4a is a section view illustrating exposure using a fourth mask in a conventional process. FIG. 4b is a section view after developing using the fourth mask in a conventional process. FIG. 5a is a section view for exposure using a fifth mask in a conventional process. FIG. 5b is a section view after developing using the fifth mask in a conventional process. A specific workflow of the illustrated conventional process is described below by example.

In the first masking process of FIGS. 1a and 1b, a layer of metal thin film 11 is first deposited on a substrate 1, followed by coating a layer of photoresist 210 on the metal thin film 11. After pre-baking, the photoresist 210 is exposed to UV light 30 through a first mask plate 21 (as shown in FIG. 1a), so that an exposed portion 211 and an unexposed portion 212 of the photoresist 210 are formed. After developing, only a pattern of the unexposed portion 212 of the photoresist is left on the position of a gate electrode and a gate line (as shown in FIG. 1b). Next, the gate electrode and gate line are formed through post-baking, etching, and photoresist lifting-off.

In the second masking process of FIGS. 2a and 2b, a gate insulating film 12 and an amorphous silicon semiconductor film 13 are sequentially deposited on the substrate 1 after the first masking process. Then a layer of photoresist 220 is coated on the amorphous silicon semiconductor film 13. After pre-baking, the photoresist 220 is exposed to UV light 30 through a second mask plate 22 (as shown in FIG. 2a), so that an exposed portion 221 and an unexposed portion 222 of the photoresist 220 are formed. After developing, only a pattern of the unexposed portion 222 of the photoresist is left on the position of an active layer (as shown in FIG. 2b). Next, a gate insulating layer and the active layer are formed through post-baking, etching, and photoresist lifting-off.

In the third masking process of FIGS. 3a and 3b, a layer of metal thin film 14 is deposited on the substrate 1 after the second masking process, followed by coating a layer of photoresist 230 on the metal thin film 14. After pre-baking, the photoresist 230 is exposed to UV light 30 through a third mask plate 23 (as shown in FIG. 3a), so that an exposed portion 231 and an unexposed portion 232 of the photoresist 230 are formed. After developing, only a pattern of the unexposed portion 232 of the photoresist is left on the positions of a source and drain electrode layer (as shown in FIG. 3b). Next, a source and drain electrode layer is formed through post-baking, etching, and photoresist lifting-off.

In the fourth masking process of FIGS. 4a and 4b, a layer of passivation film 15 is deposited on the substrate 1 after the third masking process, followed by coating a layer of photoresist 240 on the passivation film 15. After pre-baking, the photoresist 240 is exposed to UV light 30 through a fourth mask plate 24 (as shown in FIG. 4a), so that an exposed portion 241 and an unexposed portion 242 of the photoresist 240 are formed. After developing, only a pattern of the unexposed portion 242 of the photoresist is left on the passivation layer except for the position for a via hole (as shown in FIG. 4b). Next, the via hole in the passivation layer is formed through post-baking, etching, and photoresist lifting-off.

In the fifth masking process of FIGS. 5a and 5b, a layer of transparent pixel electrode film 16 is deposited on the substrate 1 after the fourth masking process, followed by coating a layer of photoresist 250 on the transparent pixel electrode film 16. After pre-baking, the photoresist 250 is exposed to UV light 30 through a fifth mask plate 25 (as shown in FIG. 5a), so that an exposed portion 251 and an unexposed portion 252 of the photoresist 250 are formed. After developing, only a pattern of the unexposed portion 252 of the photoresist is left on the position of a pixel area (as shown in FIG. 5b). Next, a pixel electrode is formed through post-baking, etching, and photoresist lifting-off.

It is shown that the conventional technology has a number of steps in the photolithography process, which will inevitably result in some floating particles in the air falling on the substrate and causing deterioration. In addition, equipments such as an exposure device and a development device are expensive, with high operation cost and maintenance cost, thereby manufacturing cost for the array substrate is increased.

SUMMARY OF THE INVENTION

According to an embodiment of the invention, there is provided a masking process using photoresist, comprising: attaching a compress mask plate to a substrate; coating photoresist in a mask pattern of the compress mask plate; baking the photoresist from the substrate side; removing the compress mask plate from the substrate to form a desired photoresist pattern on the substrate.

According to another embodiment of the invention, there is provided a mask plate for a masking process, comprising an opening in a pattern for receiving photoresist therein.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein.

DETAILED DESCRIPTION OF THE PREFERRED EMBODIMENTS

Figure 1A:
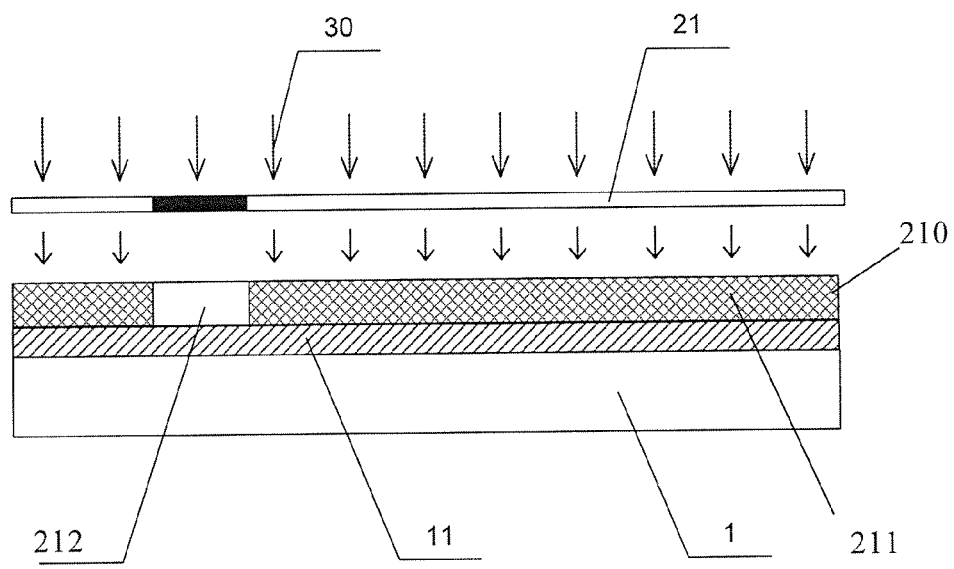
FIG. 1a is a cross-section view illustrating a first mask exposure in a conventional technology.
Figure 1B:
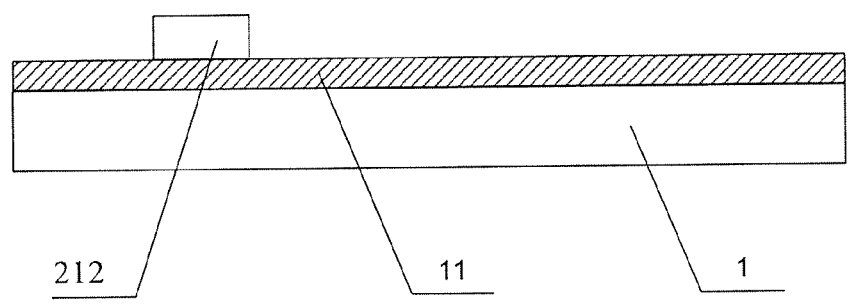
FIG. 1b illustrates a cross-section view after a first mask developing in the conventional technology.
Figure 2A:
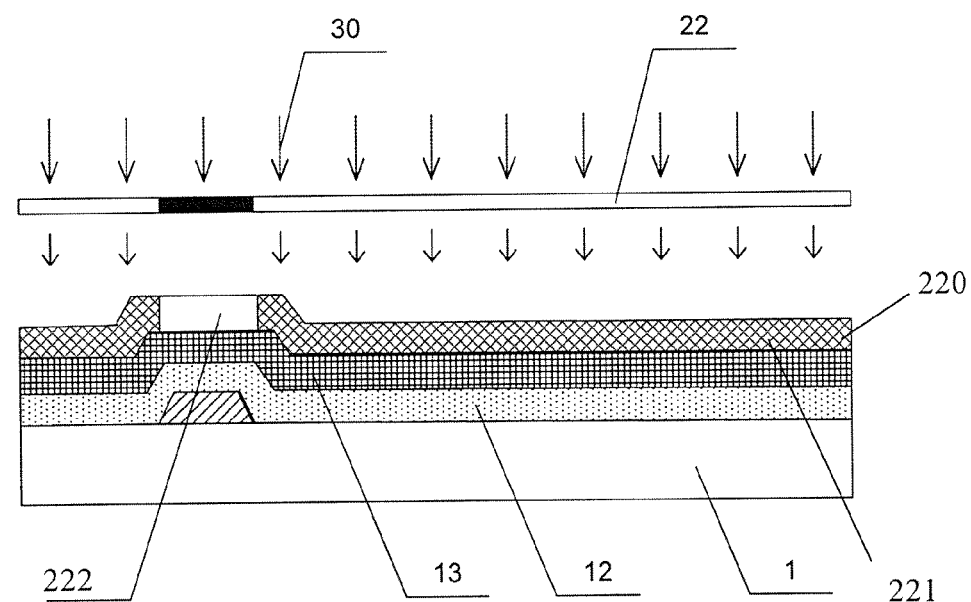
FIG. 2a is a cross-section view illustrating a second mask exposure in the conventional technology.
Figure 2B:
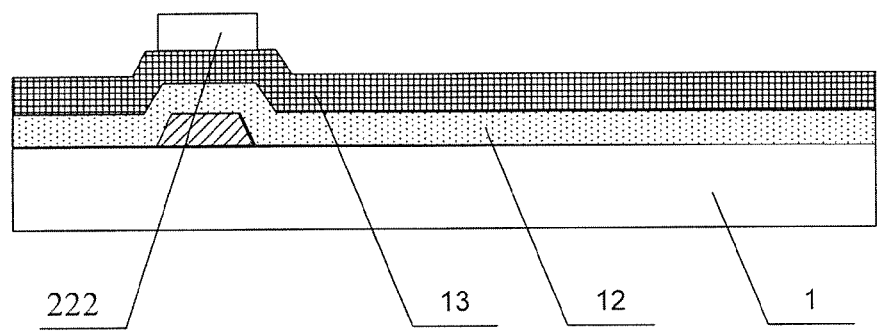
FIG. 2b illustrates a cross-section view after a second mask developing in the conventional technology.
Figure 3A:
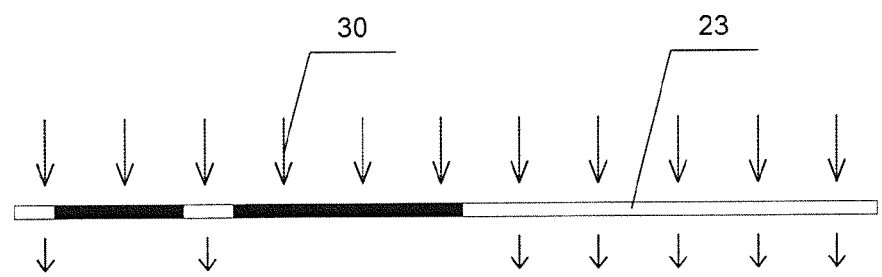
FIG. 3a is a cross-section view illustrating a third mask exposure in the conventional technology.
Figure 3A:
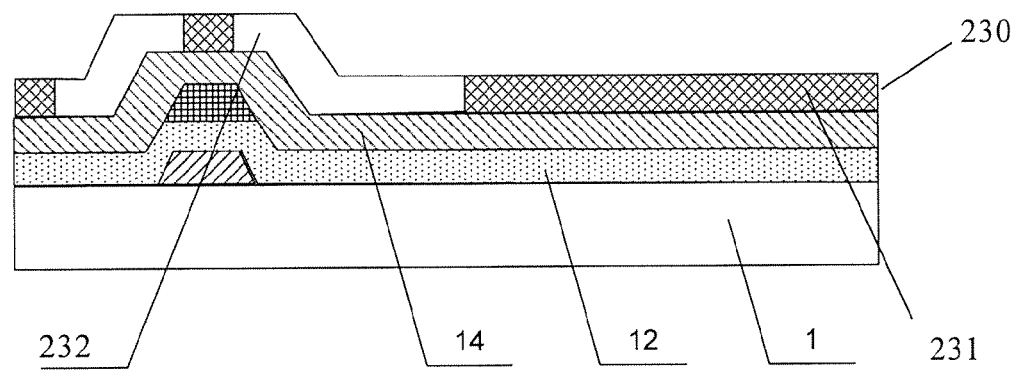
Figure 3B:
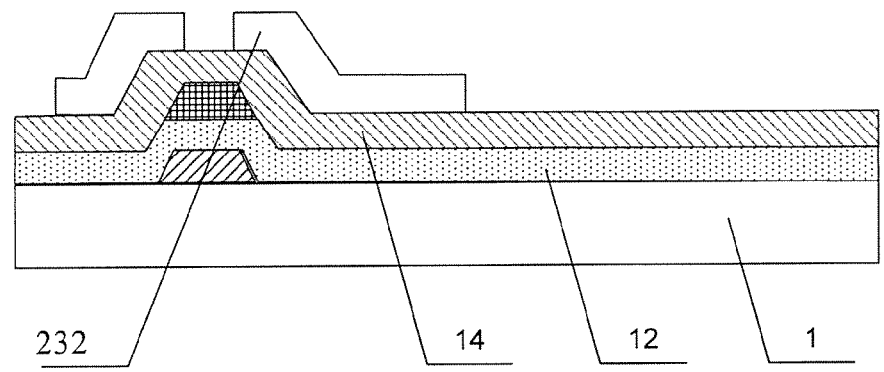
FIG. 3b illustrates a cross-section view after a third mask developing in the conventional technology.
Figure 4A:
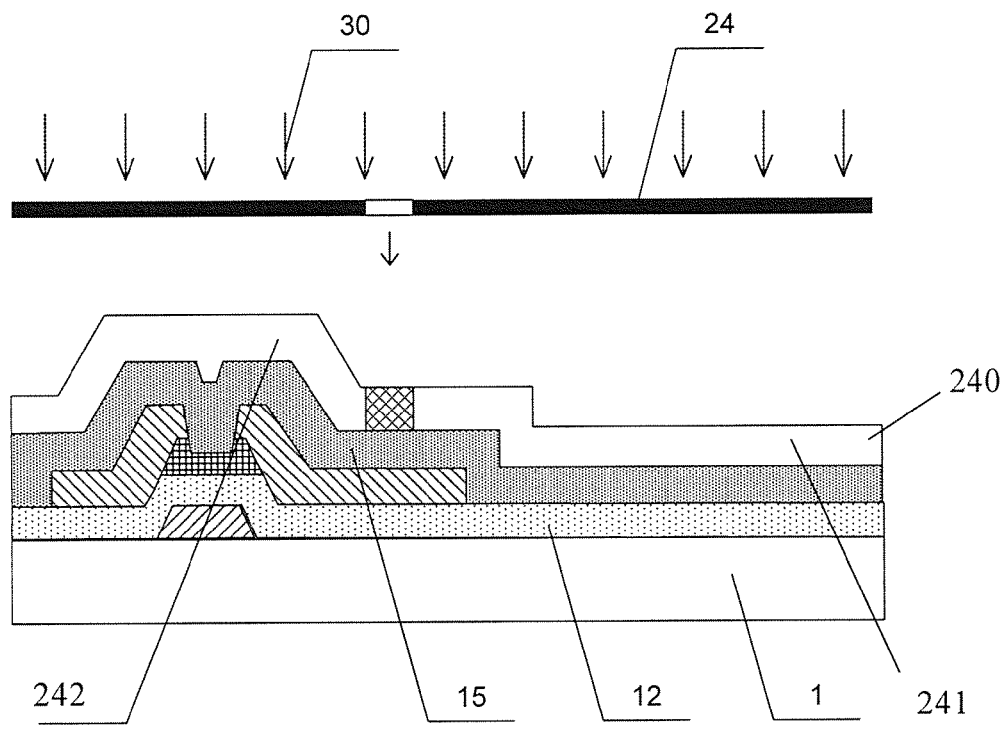
FIG. 4a is a cross-section view illustrating a fourth mask exposure in the conventional technology.
Figure 4B:
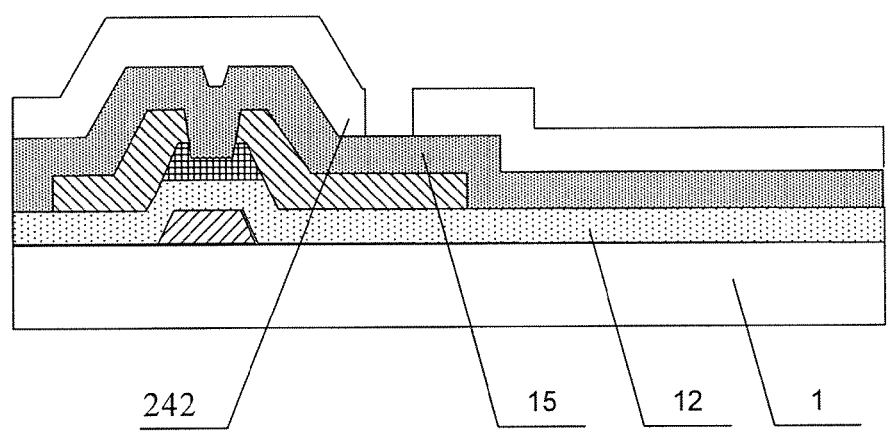
FIG. 4b illustrates a cross-section view after a fourth mask developing in the conventional technology.
Figure 5A:
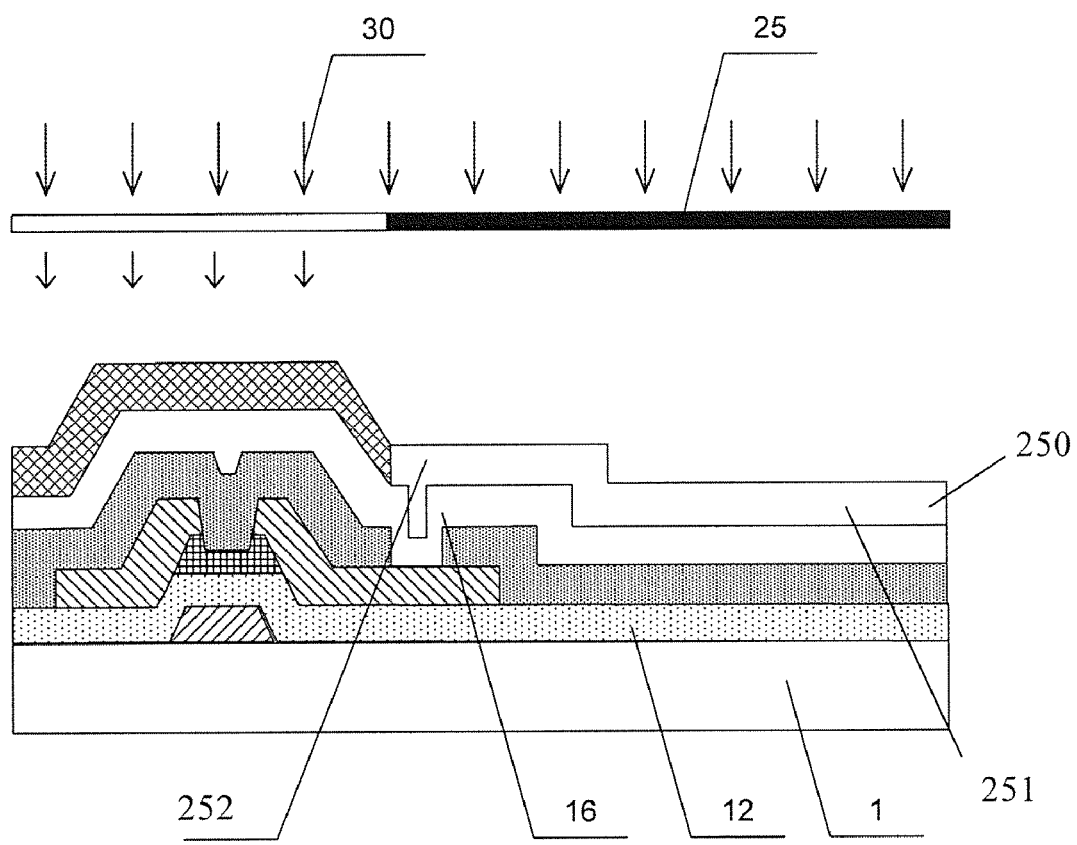
FIG. 5a is a cross-section view illustrating a fifth mask exposure in the conventional technology.
Figure 5B:
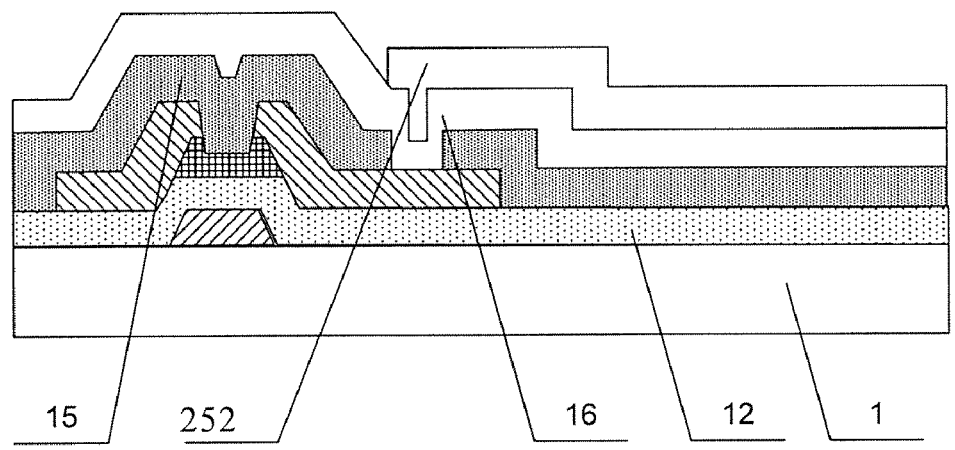
FIG. 5b illustrates a cross-section view after a fifth mask developing in the conventional technology.
Figure 6:
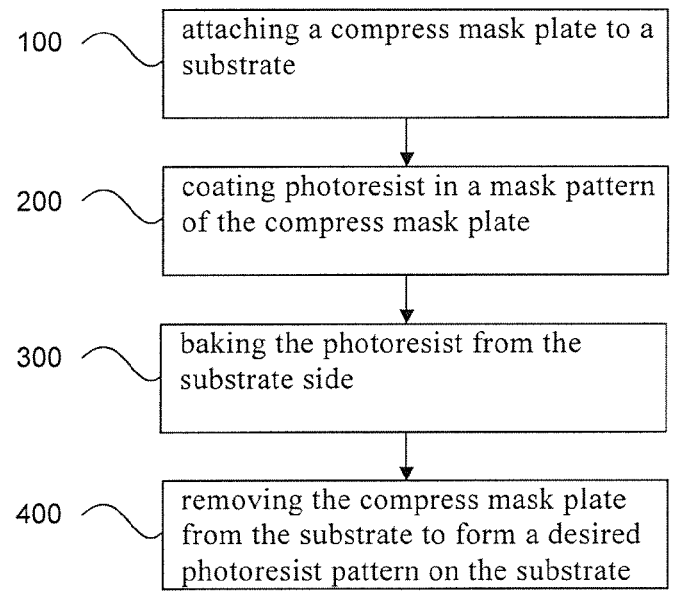
FIG. 6 is a workflow diagram for a masking process using photoresist according to an embodiment of the present invention.

FIG. 6 is a workflow diagram for an exemplary masking process using photoresist according to an embodiment of the present invention, which may comprises the steps of:

step 100, attaching a compress mask plate to a substrate;

step 200, coating photoresist in a mask pattern of the compress mask plate;

step 300, baking the photoresist from the substrate side; and step 400, removing the compress mask plate from the substrate to form a desired photoresist pattern on the substrate.

The embodiment according to the invention provides a photolithography process using a compress mask plate, with reduced steps, relative cheap equipments, and low manufacturing cost. In the inventive method of the embodiment, the exposure device and developing device in a conventional technology are no longer employed. The five steps of coating photoresist, pre-baking, exposing, developing and post-baking in a conventional photolithography process can be simplified to two steps of coating photoresist and post-baking. As such, the photolithography process is simplified to a large degree, thereby the process time can be shortened, the yield can be increased, and deterioration can be avoided. Further, the inventive method of the embodiment saves the equipment investment and lowers the manufacturing cost, which in turn results in the decreasing of the products cost.

The compress mask plate according to an embodiment of the invention is designed to have a same shape and size to that of the substrate, and is provided with compress mask pattern of a through hole shape. The compress mask plate is of a non-metal material that has anti-oxidation, high temperature resistance, and corrosion resistance, or some other metal material, which is expected to have a certain lengthwise elasticity coefficient. The mask pattern of the compress mask plate is formed through planography method, which can be further combined with nanotechnology by taking advantage of the small size of nanotechnology to produce miniaturized mask pattern. Planography method has evolved from a single printing plate to a series of printing plates, which have various structures and various functions and can meet various usage demands. The printing forme (printing plate) have developed to have various kinds, such as chromium offset plate, waterless plate, and CTP plate, which may be used for preparing the mask patterns on the compress mask plate according to the embodiment of the invention.

In the inventive method according to the embodiment, a compress mask plate having substantially the same shape and size as a substrate (for example, a glass substrate) is first closely attached on the substrate, meanwhile the compress mask plate and the substrate are aligned with each other using an align mark. To prevent misalignment between layers, the compress mask plate and compress mask pattern thereon can both have 4~12 align marks. Next, photoresist is coated in the mask patterns on the compress mask plate using a roll coating method or a spin coating method. To obtain the photoresist thickness required by the etching process, in the embodiment the amount of the coated photoresist is controlled so that the photoresist is coated in the mask patterns on the compress mask plate to a thickness of about 1 to about 5 µm. In a roll coating method, the coating thickness is controlled by adjusting the moving speed of the substrate during the coating process. A higher moving speed results in a thinner coated film, and a slower moving speed results in a thicker coated film. In a spin coating method, the coating thickness is controlled by adjusting the rotation speed of the substrate during the coating process. A higher rotation speed results in a thinner coated film, and a slower rotation speed results in a thicker coated film. Thereafter, the photoresist is baked from the side of the substrate to increase adhesion to the substrate. Specifically, the baking temperature is between about 80 and about 160° C., and the baking time is between about 5 and about 50 seconds. Preferably, the baking temperature is between about 110 and about 130° C., and the baking time is between about 10 and about 30 seconds. Preferably, the substrate may be pre-heated before coating the photoresist on the substrate so as to enhance the adhesion between the photoresist to be coated and the substrate. As described below, photoresist has solvent as its main component and thus has week adhesion. In addition, the opening in the mask patterns on the compress mask plate has sharp step. Therefore, when the compress mask plate with photoresist coated thereon is removed from the substrate, the photoresist can be broken at the sharp step, and a good photoresist pattern can be left on the surface of the substrate.

In the embodiment according to the invention, the photoresist may be a positive photoresist or a negative photoresist. For example, the photoresist may have the following compositions in weight percent:

solvent: 70%~75%;
polymer resin (e.g., novolak resin): 19%~24%
sensitizer (e.g., PAC): 5%~6%; and
additives: 1%~5%.

The masking process using photoresist according to the embodiment of the invention is applicable not only to the manufacturing process for an array substrate or a color filter substrate of a LCD, but also to a manufacturing process for a semiconductor device. Hereafter, the masking process using photoresist according to the embodiment is further described taking a manufacturing process of a TFT-LCD array substrate as an example.

Figure 7A:
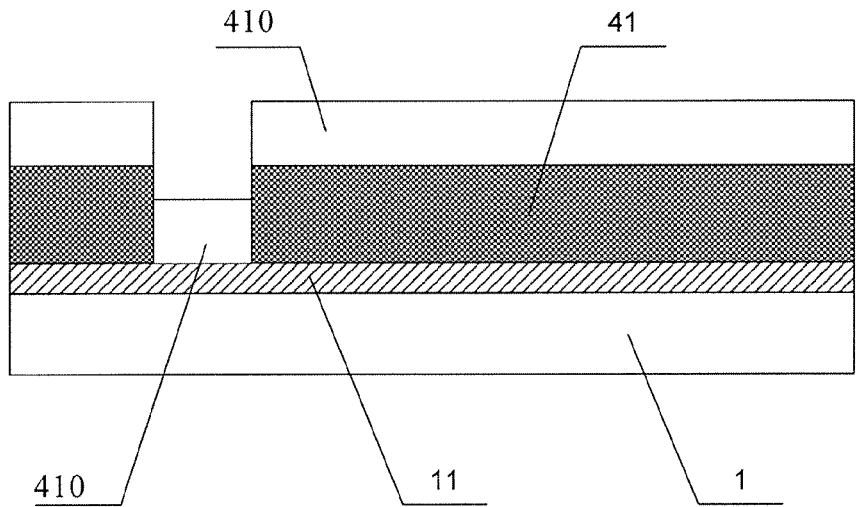
FIG. 7a is a cross-section view illustrating photoresist coating for a first mask according to an embodiment of the invention.
Figure 7B:
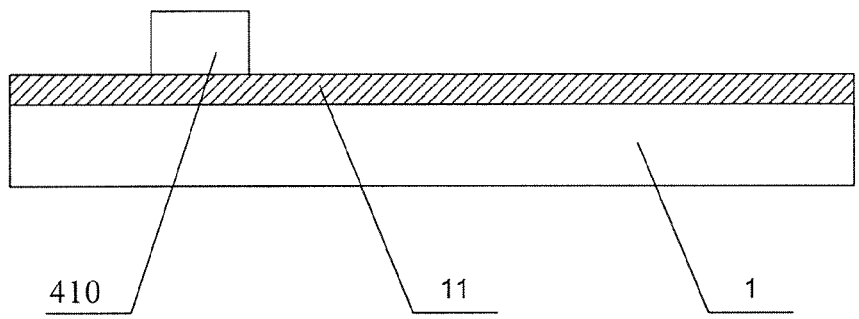
FIG. 7b illustrates a cross-section view after the first masking process is competed.

FIG. 7a is a cross-section view illustrating photoresist coating for a first mask according to an embodiment of the invention; FIG. 7b illustrates a cross-section view after the first masking process is competed; and FIG. 7c is a cross-section view illustrating a gate electrode formed using the first mask.

Figure 7C:
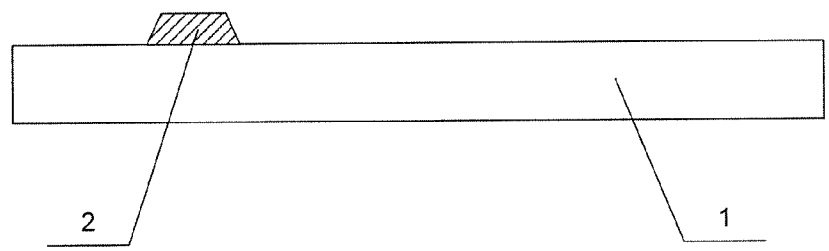
FIG. 7c is a cross-section view illustrating a gate electrode formed using the first mask.

In the first masking process as shown in FIGS. 7a~7c, a layer of metal thin film 11 is first deposited on a substrate 1. Next, a first compress mask plate 41 and the substrate 1 are closely attached to and aligned with each other. Photoresist 410 is coated in the mask pattern on the first compress mask plate 41 (as shown in FIG. 7a). The photoresist is coated in an opening corresponding to the pattern of the mask plate. After the photoresist is baked, the first mask plate is removed from the substrate 1, and a photoresist pattern is formed on a position of the substrate corresponding to a gate electrode (as shown in FIG. 7b). Next, the gate electrode 2 and a gate line (not shown) are formed through etching with the photoresist pattern, and then the photoresist is lifted off (as shown in FIG. 7c) from the substrate.

Figure 8A:
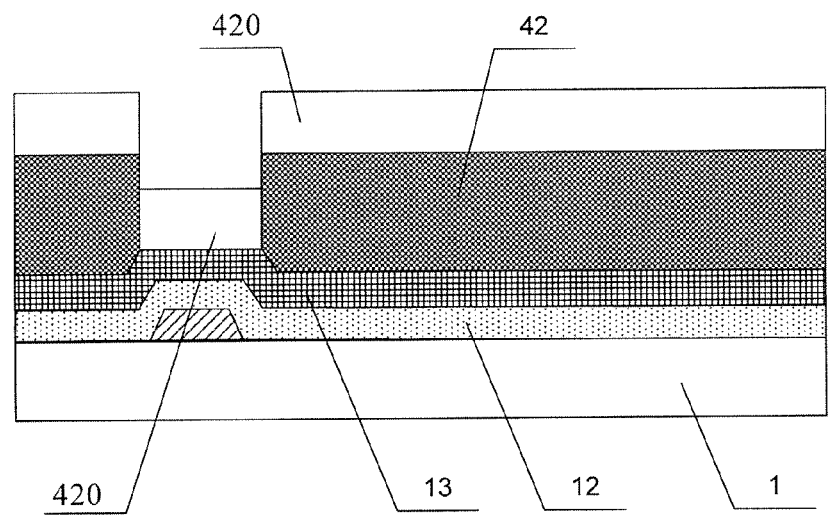
FIG. 8a is a cross-section view illustrating photoresist coating for a second mask according to the embodiment of the invention.
Figure 8B:
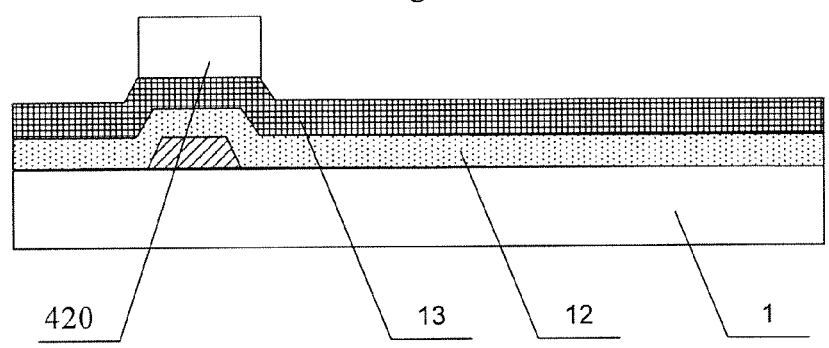
FIG. 8b illustrates a cross-section view after the second masking process is competed.

FIG. 8a is a cross-section view illustrating photoresist coating for a second mask according to an embodiment of the invention; FIG. 8b illustrates a cross-section view after the second masking process is competed; and FIG. 8c is a cross-section view illustrating a gate insulating layer and an active layer formed using the second mask.

Figure 8C:
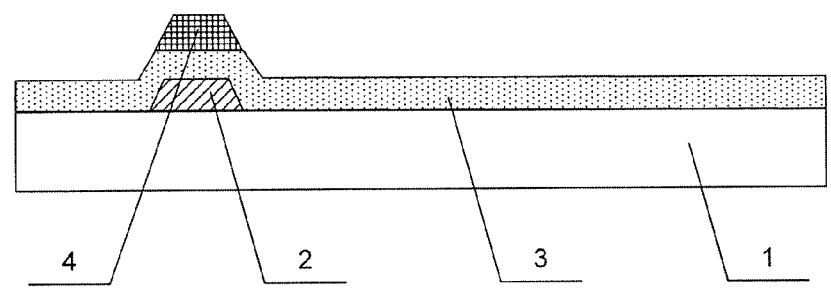
FIG. 8c is a cross-section view illustrating a gate insulating layer and an active layer formed using the second mask.

In the second masking process as shown in FIGS. 8a~8c, a gate insulating film 12 and an amorphous silicon semiconductor film 13 are sequentially deposited on the substrate after the first masking process. Next, a second compress mask plate 42 and the substrate 1 are closely attached to and aligned with each other. To achieve a close attachment, a portion of the mask plate 42 corresponding to the gate line preferably has a concave portion with respect to a convex portion on the substrate. Photoresist 420 is coated in the mask pattern on the second compress mask plate 42 (as shown in FIG. 8a), and the photoresist is coated in an opening corresponding to the pattern on the mask plate. After the photoresist is baked, the second mask plate is removed from the substrate 1, and a photoresist pattern is formed on a position on the substrate corresponding to an active layer (as shown in FIG. 8b). Next, a gate insulating layer 3 and an active layer 4 are formed through etching, and then the photoresist is lifted off (as shown in FIG. 8c).

Figure 9A:
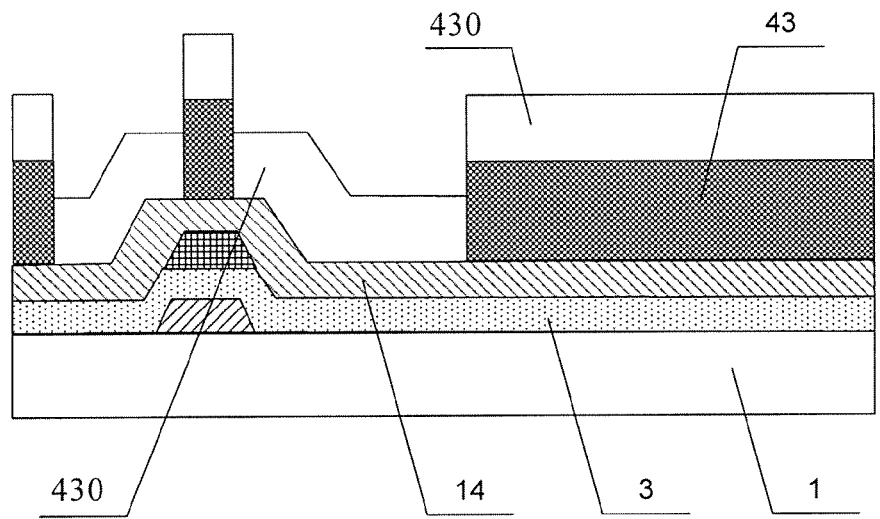
FIG. 9a is a cross-section view illustrating photoresist coating for a third mask according to the embodiment of the invention.
Figure 9B:
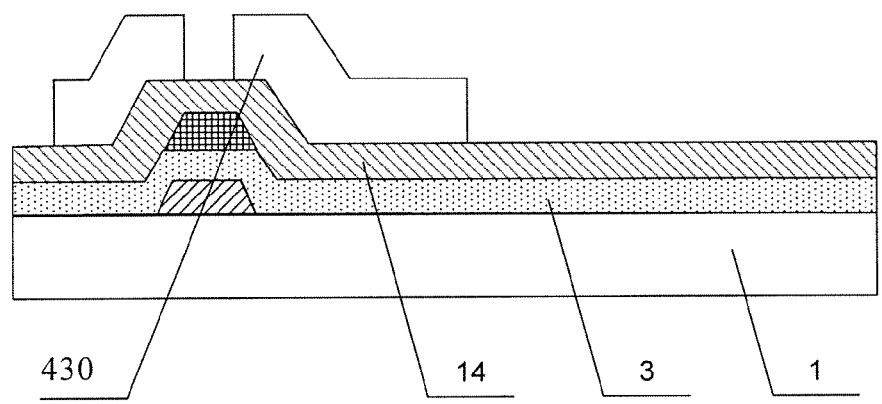
FIG. 9b illustrates a cross-section view after the third masking process is competed.

FIG. 9a is a cross-section view illustrating photoresist coating for a third mask according to an embodiment of the invention; FIG. 9b illustrates a cross-section view after the third masking process is competed; and FIG. 9c is a cross-section view illustrating a source and drain electrode layer formed using the third mask.

Figure 9C:
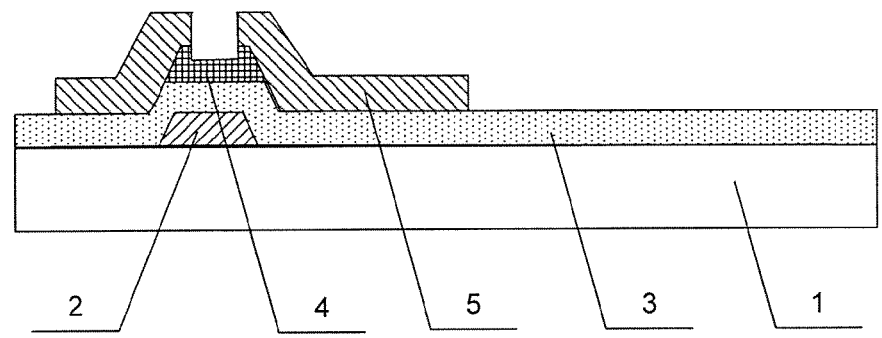
FIG. 9c is a cross-section view illustrating a source and drain electrode layer formed using the third mask.

In the third masking process as shown in FIGS. 9a~9c, a layer of metal thin film 14 is deposited on the substrate 1 after the second masking process. Next, a third compress mask plate 43 and the substrate 1 are closely attached to and aligned with each other. In this point, the mask plate 43 preferably has portions corresponding to portions of different thicknesses on the substrate. Photoresist 430 is coated in the mask pattern on the third compress mask plate 43 (as shown in FIG. 9a), and the photoresist is coated in an opening corresponding to the pattern on the mask plate. After the photoresist is baked, the third mask plate is removed from the substrate 1, and a photoresist pattern is formed on a position on the substrate corresponding to a source and drain electrode layer (as shown in FIG. 9b). Next, a source and drain electrode layer 5 is formed through etching, and the photoresist is lifted off (as shown in FIG. 9c).

Figure 10A:
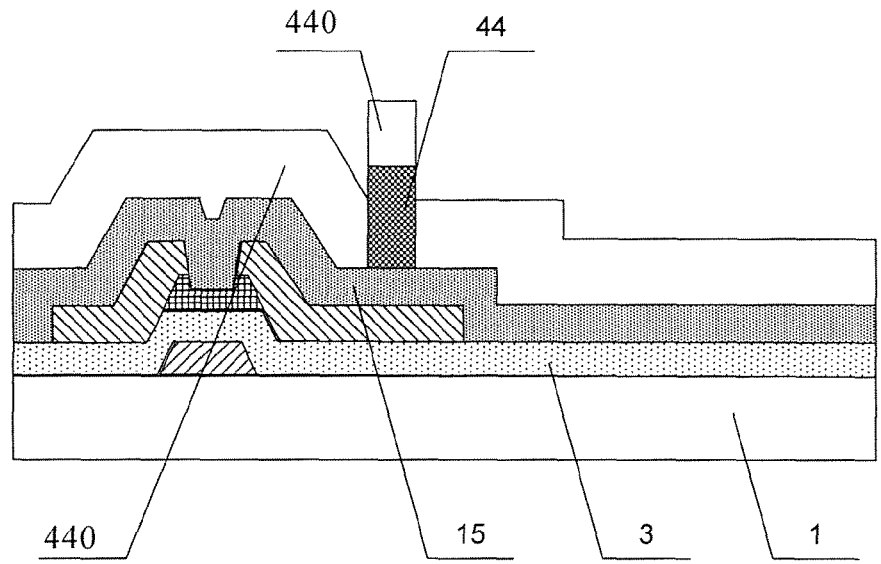
FIG. 10a is a cross-section view illustrating photoresist coating for a fourth mask according to the embodiment of the invention.
Figure 10B:
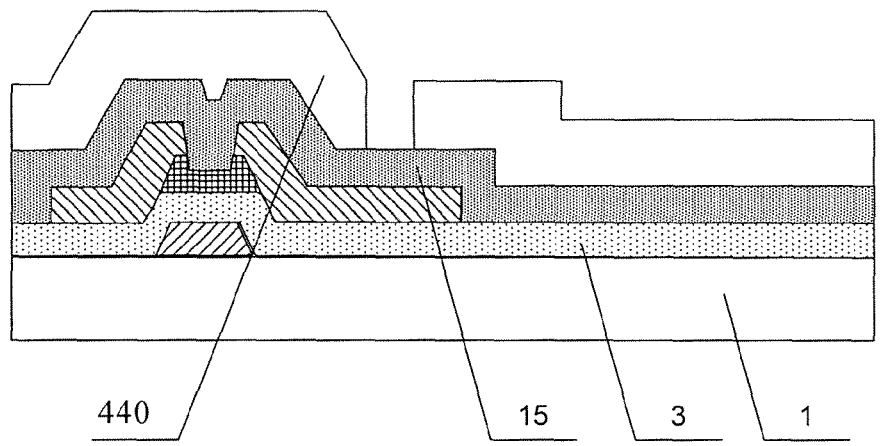
FIG. 10b illustrates a cross-section view after the fourth masking process is competed.

FIG. 10a is a cross-section view illustrating photoresist coating for a fourth mask according to an embodiment of the invention; FIG. 10b illustrates a cross-section view after the fourth masking process is competed; and FIG. 10c is a cross-section view illustrating a passivation layer formed using the fourth mask.

Figure 10C:
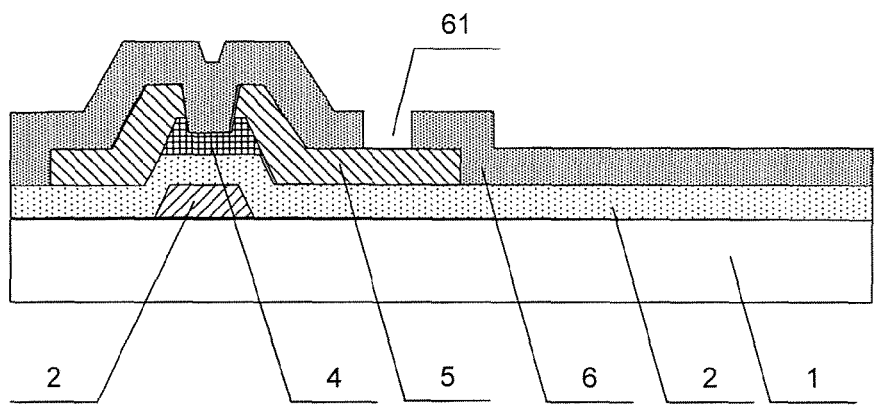
FIG. 10c is a cross-section view illustrating a passivation layer formed using the fourth mask.

In the fourth masking process as shown in FIGS. 10a~10c, a layer of passivation film 15 is deposited on the substrate 1 after the third masking process. Next, a fourth compress mask plate 44 and the substrate 1 are closely attached to and aligned with each other. Photoresist 440 is coated in the mask pattern on the fourth compress mask plate 44 (as shown in FIG. 10a), and the photoresist is coated in an opening corresponding to the pattern on the mask plate. After the photoresist is baked, the fourth mask plate is removed from the substrate 1, and a photoresist pattern is formed on the passivation layer except for the position for a via hole (as shown in FIG. 10b). Next, a passivation layer via hole 61 is formed through etching, and then the photoresist is lifted off (as shown in FIG. 10c).

Figure 11A:
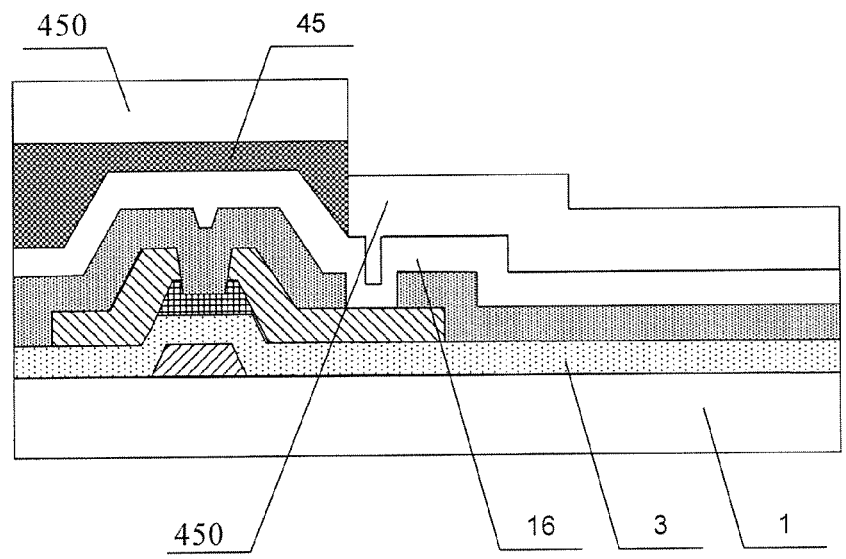
FIG. 11a is a cross-section view illustrating photoresist coating for a fifth mask according to the embodiment of the invention.
Figure 11B:
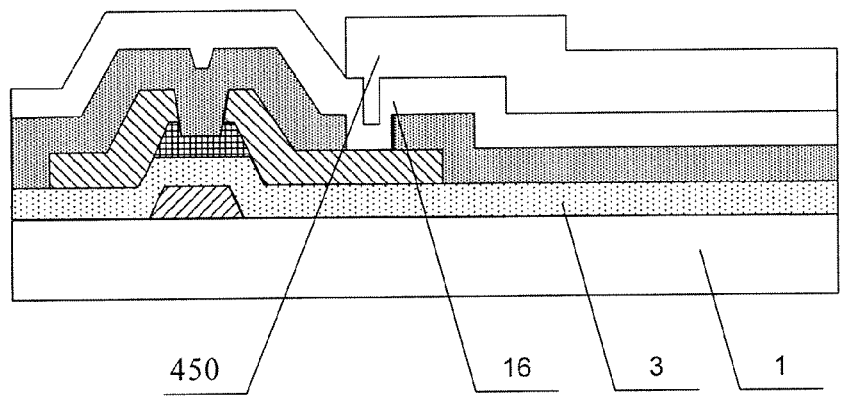
FIG. 11b illustrates a cross-section view after the fifth masking process is competed.

FIG. 11a is a cross-section view illustrating photoresist coating for a fifth mask according to an embodiment of the invention; FIG. 11b illustrates a cross-section view after the fifth masking process is competed; and FIG. 11c is a cross-section view illustrating a pixel electrode formed using the fifth mask.

Figure 11C:
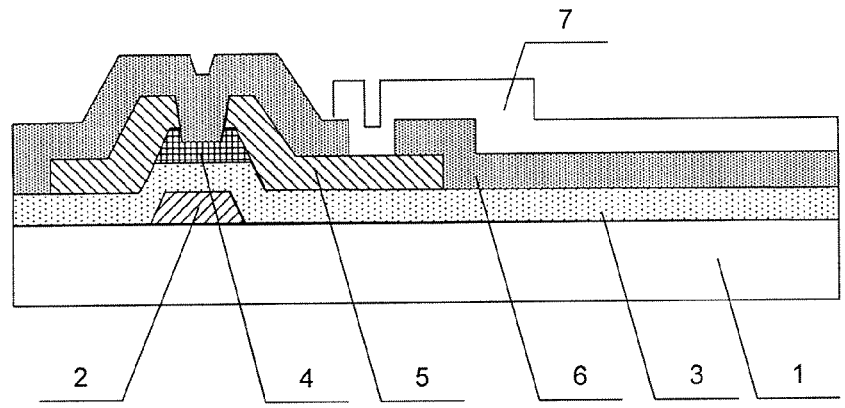
FIG. 11c is a cross-section view illustrating a pixel electrode formed using the fifth mask.

In the fifth masking process as shown in FIGS. 11a~11c, a layer of transparent pixel electrode film 16 is deposited on the substrate 1 after the fourth masking process. Next, a fifth compress mask plate 45 and the substrate 1 are closely attached to and aligned with each other. To achieve a close attachment, the mask plate 45 preferably has a concave portion corresponding to a convex portion on the substrate. Photoresist 450 is coated in the mask pattern on the second compress mask plate 45 (as shown in FIG. 11a), with the photoresist is coated in an opening corresponding to the pattern on the mask plate. After the photoresist is baked, the fifth mask plate is removed from the substrate 1, and a photoresist pattern is formed on the position of a pixel area (as shown in FIG. 11b). Next, a pixel electrode 7 is formed through etching, and then the photoresist is lifted off (as shown in FIG. 11c).

Figure 12:
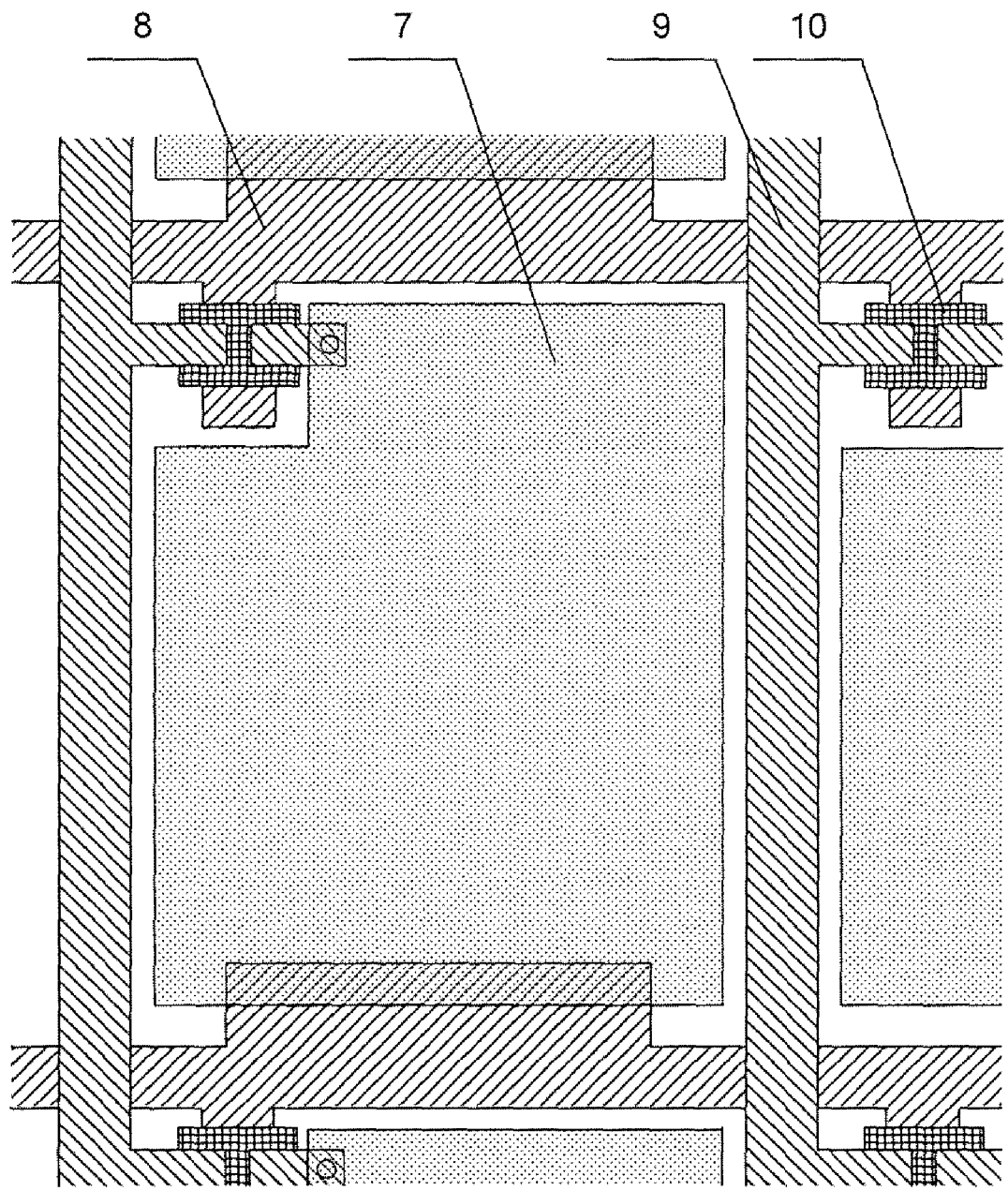
FIG. 12 is a plan view of an array substrate prepared using a masking process using photoresist according to the embodiment of the invention.

FIG. 12 is a plan view of an array substrate prepared using the masking process using photoresist according to the embodiment of the invention. The substrate includes the pixel electrode 7, the gate line 8, the data line 9, and the TFT 10 that are formed thereon. For the TFT 10, the gate electrode thereof is connected to the gate line 8, the source electrode in the source and drain electrode layer is connected to the data line 9, and the drain electrode in the source and drain electrode layer is connected to the pixel electrode 7. The structure and configuration of the TFT 10 have been illustrated with reference to FIGS. 7c, 8c, 9c, 10c and 11c, so description is omitted herein for simplicity.

From the above exemplary method according to the embodiment of the invention, it shows that the five steps of coating photoresist, pre-baking, exposing, developing, and post-baking in a conventional photolithography process can be simplified to two steps of coating photoresist and post-baking by using a compress mask plate. As such, the photolithography process can be simplified to a large degree, thereby the process time can shortened and the yield can increased. Due to the reduced steps, deterioration caused by negative influence on the substrate by floating particles in the air can be effectively prevented. Further, since the exposure device and developing device in a conventional process are no longer needed, the implementation of the invention saves the equipment investment and lowers the manufacturing cost, the occupancy expenses and the routine maintenance cost, which in turn results in the decrease of products cost.

Although the present invention has been described in detail referring to the preferred embodiments, the above embodiments are used only for illustration and not for the purpose of limitation. Accordingly, it will be understood by those of ordinary skill in the art that it is possible to use other materials and equipments if necessary, and that various modifications or equivalent alterations may be made to the embodiments of the present invention without departing from the spirit and scope of the present invention as set forth in the following claims.

What is claimed is:

1. A masking process using photoresist, comprising:
   attaching a compress mask plate to a substrate and exposing a portion of the substrate through a mask pattern of the compress mask plate;
   coating photoresist through the mask pattern of the compress mask plate and thus on the exposed portion of the substrate;
   baking the photoresist from the substrate side;
   removing the compress mask plate from the substrate to form a desired photoresist pattern on the substrate, wherein said coating, baking and mask removal steps are carried out sequentially without any intervening irradiation step.

2. The method according to claim 1, wherein attaching the compress mask plate to the substrate comprising:
   attaching the compress mask plate having a same shape and size as the substrate to the substrate, and aligning the compress mask plate with the substrate using an align mark.

3. The method according to claim 1, wherein coating photoresist in the mask pattern of the compress mask plate comprising:
   coating the photoresist in the mask pattern on the compress mask plate using a roll coating method or a spin coating method.

4. The method according to claim 1, wherein coating photoresist in the mask pattern of the compress mask plate comprising:
   coating the photoresist in the mask pattern on the compress mask plate to a thickness of about 1~5 μm by controlling an amount of the coated photoresist.

5. The method according to claim 1, wherein baking the photoresist from the substrate side comprising:
   baking the photoresist at a baking temperature of about 80~160° C. from the substrate side.

6. The method according to claim 1, wherein baking the photoresist comprising: baking the photoresist for about 5 to about 50 seconds.

7. The method according to claim 1, wherein the photoresist is positive photoresist or negative photoresist.

8. The method according to claim 1, wherein the compress mask plate is made of a nonmetal material or a metal material.

9. The method according to claim 8, wherein the mask pattern in the compress mask plate is formed through a planography method.

10. The method according to claim 1, wherein the photoresist comprises following compositions in weight percent: solvent of 70%~75%, polymer resin of 19%~24, sensitizer of 5%~6%, and additives of 1%~5%.

11. A mask plate for a masking process, comprising an opening in a pattern for receiving photoresist therein when the photoresist is coated through the mask plate.

12. The mask according to claim 11, further comprising an alignment mark.

* * * * *